US010497580B2

(12) United States Patent
Sakurai

(10) Patent No.: US 10,497,580 B2
(45) Date of Patent: Dec. 3, 2019

(54) PLASMA ETCHING METHOD

(71) Applicant: ZEON CORPORATION, Chiyoda-ku, Tokyo (JP)

(72) Inventor: Takaaki Sakurai, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 16/082,672

(22) PCT Filed: Mar. 16, 2017

(86) PCT No.: PCT/JP2017/010804
§ 371 (c)(1),
(2) Date: Sep. 6, 2018

(87) PCT Pub. No.: WO2017/164089
PCT Pub. Date: Sep. 28, 2017

(65) Prior Publication Data
US 2019/0252202 A1    Aug. 15, 2019

(30) Foreign Application Priority Data

Mar. 25, 2016  (JP) ................... 2016-062039

(51) Int. Cl.
| | | |
|---|---|---|
| H01L 21/311 | (2006.01) | |
| H01L 21/3105 | (2006.01) | |
| H01L 21/306 | (2006.01) | |
| H01L 21/3065 | (2006.01) | |

(52) U.S. Cl.
CPC .. *H01L 21/31116* (2013.01); *H01L 21/31053* (2013.01); *H01L 21/31105* (2013.01); *H01L 21/3065* (2013.01); *H01L 21/30621* (2013.01)

(58) Field of Classification Search
CPC ......... H01L 21/31116; H01L 21/31053; H01L 21/31105; H01L 21/30621; H01L 21/3065
See application file for complete search history.

(56) References Cited

U.S. PATENT DOCUMENTS

| 4,595,601 A * | 6/1986 | Horioka ............. C04B 41/4505 |
| | | 216/51 |
| 2002/0132486 A1* | 9/2002 | Williams ............ H01L 21/3065 |
| | | 438/712 |
| 2003/0003755 A1* | 1/2003 | Donohoe .......... H01L 21/31116 |
| | | 438/706 |
| 2014/0073139 A1 | 3/2014 | Suzuki et al. |

FOREIGN PATENT DOCUMENTS

| EP | 2511948 A1 | 10/2012 |
| WO | 2012124726 A1 | 9/2012 |

OTHER PUBLICATIONS

Sep. 25, 2018, International Preliminary Report on Patentability issued in the International Patent Application No. PCT/JP2017/010804.

Oct. 16, 2019, the Extended European Search Report issued by the European Patent Office in the corresponding European Patent Application No. 17770131.5.

* cited by examiner

*Primary Examiner* — Duy Vu N Deo
(74) *Attorney, Agent, or Firm* — Kenja IP Law PC

(57) ABSTRACT

A plasma etching method according to the present disclosure includes a first etching step of performing plasma etching of the silicon nitride film on the workpiece by supplying a processing gas containing a gas of a compound represented by a composition formula $C_3H_2BrF_3$ including a 2-bromo-3,3,3-trifluoropropene gas, a (Z)-1-bromo-3,3,3-trifluoropropene gas, an (E)-1-bromo-3,3,3-trifluoropropene gas, and/or a 3-bromo-2,3,3-trifluoropropene gas into the processing chamber, such that a ratio $CF_2/F$ obtained by emission spectrometry of the gas of the compound represented by the composition formula $C_3H_2BrF_3$ is at least 0.33 within the processing chamber.

4 Claims, No Drawings

PLASMA ETCHING METHOD

TECHNICAL FIELD

The present disclosure relates to a plasma etching method and, in particular, to a method capable of selectively performing plasma etching to a silicon nitride film.

BACKGROUND

In the manufacture of semiconductor devices, plasma etching may be performed using a processing gas for microfabrication of a thin film formed on a workpiece. The thin film may be, for example, a silicon compound film such as a silicon nitride film or a silicon oxide film, an organic film which is mainly composed of carbon and may be formed of amorphous carbon or a photoresist composition, or an inorganic film containing which is mainly composed of an inorganic material and may be formed of a polycrystalline silicon film or amorphous silicon. When one of the thin films of different types is determined as an etching target film and another thin film as a non-target film, it is necessary to selectively etch the etching target film avoiding the non-target film. That is, etching needs to be performed highly selectively. Also, it is recently demanded to further reduce an impact on the environment in the manufacture of the semiconductor devices.

As such, a plasma etching method for selectively etching a silicon oxide film on a substrate serving as a workpiece is suggested (e.g., see PTL 1 set forth below). PTL 1 discloses a plasma etching method that uses a plasma etching gas containing fluorocarbon with 3 or 4 carbon atoms having at least one unsaturated bond and/or ether bond and also having a bromine atom. This plasma etching method may selectively etch a silicon oxide film in an excellent manner by using the plasma etching gas having short atmospheric lifetime and relatively small impact on the environment.

CITATION LIST

Patent Literature

PTL 1: WO2012/124726

SUMMARY

Technical Problem

In the manufacture of the semiconductor devices, on the other hand, it is also necessary to selectively etch a silicon nitride film on the workpiece.

However, the plasma etching method disclosed in PTL 1 concerns a selective etching of the silicon oxide film and cannot selectively etch the silicon nitride film.

As such, the present disclosure aims to provide a plasma etching method capable of highly selectively etch the silicon nitride film by using a plasma etching gas having a relatively small impact on the environment.

Solution to Problem

The present inventor diligently studied to achieve the above object. As a result, the present inventor completed the present disclosure by finding that a silicon nitride film may be high selectively etched when, as a processing gas for plasma etching, a gas of a compound which has a relatively small impact on the environment and at least one unsaturated bond and may be represented by a composition formula $C_3H_2BrF_3$ is used and, simultaneously, a particular condition of an atmosphere within a processing chamber is satisfied.

That is, in order to advantageously solve the above problem, a plasma etching method according to the present disclosure is a plasma etching method capable of etching a workpiece having a silicon nitride film thereon. The plasma etching method includes a preparation step of placing the workpiece in a processing chamber, and a first etching step of performing plasma etching of the silicon nitride film on the workpiece by supplying a processing gas containing a gas of a compound represented by a composition formula $C_3H_2BrF_3$ including a 2-bromo-3,3,3-trifluoropropene gas, a (Z)-1-bromo-3,3,3-trifluoropropene gas, an (E)-1-bromo-3,3,3-trifluoropropene gas, and/or a 3-bromo-2,3,3-trifluoropropene gas into the processing chamber, such that a ratio $CF_2/F$ obtained by emission spectrometry of the gas of the compound represented by the composition formula $C_3H_2BrF_3$ is at least 0.33 within the processing chamber.

Here, according to the present disclosure, the ratio $CF_2/F$ of the gas of the compound represented by the composition formula $C_3H_2BrF_3$ may be calculated as a value ($I_{CF2}/I_F$) by obtaining an intensity $ICF_2$ of an emission spectrum ($\lambda=263$ nm) derived from $CF_2$ and an intensity $I_F$ of an emission spectrum ($\lambda=703$ nm) derived from F, from a spectrum obtained by emission spectrometry conforming to JIS (Japanese Industrial Standard) K 0116.

According to the present disclosure, further, "selective" etching used herein means an etching selectivity of greater than 1. In particular, "highly selective etching of the silicon nitride film" means that the etching selectivity is at least 2, preferably at least 10, particularly preferably infinite.

Here, the plasma etching method according to the present disclosure includes a second etching step of performing plasma etching of a silicon oxide film also formed on the workpiece, under a condition that the ratio $CF_2/F$ is smaller than 0.17. Preferably, the first etching step and the second etching step are selectively performed. The silicon nitride film and the silicon oxide film may be selectively subjected to the etching, and thus the plasma etching method is further efficient and convenient.

In the plasma etching method according to the present disclosure, preferably, a gas containing fluorine and/or carbon contained in the processing gas consists of the gas of the compound represented by the composition formula $C_3H_2BrF_3$. When the plasma etching is performed to the silicon nitride film by using the processing gas consisting of the gas of the compound represented by the composition formula $C_3H_2BrF_3$ as the gas containing fluorine and/or carbon, the silicon nitride film may be further highly selectively etched.

In the plasma etching method according to the present disclosure, preferably, the gas of the compound represented by $C_3H_2BrF_3$ contains the 2-bromo-3,3,3-trifluoropropene gas. Thus, the etching may be further selectively performed.

Advantageous Effect

The present disclosure may provide a plasma etching method capable of highly selectively etching a silicon nitride film by using a plasma etching gas having relatively small impact on the environment.

DETAILED DESCRIPTION

Hereinafter, an embodiment of the present disclosure will be described in detail. A plasma etching method according to the present disclosure may be used for a manufacturing process of a semiconductor device. The plasma etching method according to the present disclosure is a plasma etching method capable of performing plasma etching to a workpiece having a silicon nitride film thereon. The workpiece is not particularly limited and may be any object that may be used for plasma etching. Examples of the workpiece includes a glass substrate, a silicon single crystal wafer, and a gallium-arsenic substrate. The workpiece may include a silicon single crystal wafer having a silicon nitride film thereon and, optionally, a silicon oxide film, an organic film, and/or an inorganic film.

Note that the term "silicon nitride film" used herein refers to a film formed of a silicon compound containing a nitrogen atom such as $Si_3N_4$ (SiN), SiCN, or SiBCN. The term "silicon oxide film" used herein refers to a film formed of a silicon compound containing an oxygen atom such as $SiO_2$ SiOC, or SiOCH. The term "organic film" used herein refers to a film containing carbon as a main component. The term "containing carbon as a main component" means that carbon contained in a material forming a film accounts for more than 50% by mass and, in particular, refers to a film (hereinafter, also referred to as a resist film) formed of a carbon material such as amorphous carbon or a photoresist composition. The photoresist composition includes a KrF resist composition, an ArF resist composition, an X-ray resist composition, etc. Further, the term "inorganic film" used herein refers to a film containing an inorganic material as a main component other than the silicon oxide film and the silicon nitride film, and the inorganic material accounts for more than 50% of the film. In particular, the inorganic film includes a polycrystalline silicon film, an amorphous silicon film, or the like.

In the plasma etching method according to the present disclosure, the term "etching" refers to a technique used for a manufacturing process of a semiconductor device to engrave a highly integrated micro-pattern on a workpiece which has an etching target film and a non-target film. Also, the term "plasma etching" refers to an etching technique that utilizes a chemical reaction and physical collision between active particles and the etching target film by causing glow discharge by applying a high frequency electric field to the processing gas and separating the processing gas into chemically active ions, electrons, and neutrons.

Plasma Etching Method

The plasma etching method according to the present disclosure includes a preparation step of placing a workpiece in a processing chamber, and a first etching step of performing plasma etching of the silicon nitride film on the workpiece by supplying a processing gas containing a gas of a compound that may be represented by a composition formula $C_3H_2BrF_3$ including a 2-bromo-3,3,3-trifluoropropene gas, a (Z)-1-bromo-3,3,3-trifluoropropene gas, an (E)-1-bromo-3,3,3-trifluoropropene gas, and/or a 3-bromo-2,3,3-trifluoropropene gas into the processing chamber, such that a ratio $CF_2/F$ obtained by the emission spectrometry of the gas of the compound that may be represented by the composition formula $C_3H_2BrF_3$ is at least 0.33 within the processing chamber. The plasma etching method according to the present disclosure further includes a second etching step of performing plasma etching of a silicon oxide film also formed on the workpiece, under a condition that the ratio $CF_2/F$ is smaller than 0.17. Preferably, the first etching step and the second etching step are selectively performed. Hereinafter, each of the steps will be described.

[Preparation Step]

First, the workpiece is placed in a dry etching chamber (i.e., the processing chamber) of a plasma etching apparatus, and the processing chamber is vacuumed. Note that the plasma etching method according to the present disclosure is not particularly limited and may be performed by using common plasma etching apparatuses. Among them, reactive ion etching (RIE) apparatuses are preferable. The RIE apparatuses include a helicon wave plasma etching apparatus, a high-frequency induction plasma etching apparatus, a parallel-plate plasma etching apparatus, a magnetron plasma etching apparatus, a microwave plasma etching apparatus, etc. According to the present disclosure, the parallel-plate plasma etching apparatus, the high-frequency induction plasma etching apparatus, and the microwave plasma etching apparatus may be preferably used, for their capability to readily generate high density plasma.

In the preparation step, the temperature of the workpiece may be set to, for example, −50 degrees Celsius or higher, preferably −20 degrees Celsius or higher, particularly preferably −10 degrees Celsius or higher, and preferably 300 degrees Celsius or less, more preferably 200 degrees Celsius or less, particularly preferably 100 degrees Celsius or less. The temperature of the workpiece may be controlled by using, for example, a cooling gas such as a helium gas or a cooling apparatus. Subsequently, various gases, which will be described later, are introduced at respective predetermined rate and pressure. An introduction rate of the various gases may be determined in accordance with a mixing ratio of the various gases in the processing gas. When the processing gas is supplied into the processing chamber, the pressure within the processing chamber is maintained generally between 0.0013 Pa or more and 1300 Pa or less, preferably between 0.13 Pa or more and 5 Pa or less.

[Processing Gas]

The processing gas contains the gas of the compound that may be represented by the composition formula $C_3H_2BrF_3$ including the 2-bromo-3,3,3-trifluoropropene gas, the (Z)-1-bromo-3,3,3-trifluoropropene gas, the (E)-1-bromo-3,3,3-trifluoropropene gas, and/or the 3-bromo-2,3,3-trifluoropropene gas. Optionally, the processing gas may contain, in addition to the gas of the compound that may be represented by the composition formula $C_3H_2BrF_3$, a gas containing another fluorocarbon gas, a gas containing fluorine or carbon, a rare gas, and/or an oxygen gas. When the processing gas contains the gas of the compound that may be represented by the composition formula $C_3H_2BrF_3$ and, simultaneously, the condition (hereinafter, also referred to as a "first etching condition") that the ratio $CF_2/F$ obtained by the emission spectrometry of the gas of a specific compound that may be represented by the composition formula $C_3H_2BrF_3$ is at least 0.33 is satisfied, the silicon nitride film may be highly selectively etched over the silicon oxide film.

Here, as a result of studies by the present inventors, it was found that, among gases of the compound that may be represented by the composition formula $C_3H_2BrF_3$ having at least one unsaturated bond, which have been noted as a gas having a relatively low impact on the environment, the processing gas containing the gas of the compound that may be represented by the composition formula $C_3H_2BrF_3$ including the 2-bromo-3,3,3-trifluoropropene gas, the (Z)-1-bromo-3,3,3-trifluoropropene gas, the (E)-1-bromo-3,3,3-trifluoropropene gas, and/or the 3-bromo-2,3,3-trifluoropropene gas may demonstrate outstanding properties. That is, when the processing gas containing the gas of the specific compound that may be represented by the composition formula $C_3H_2BrF_3$ is used as a plasma etching gas under the condition that the ratio $CF_2/F$ obtained by the emission spectrometry of the gas of the specific compound that may be represented by the composition formula $C_3H_2BrF_3$ is at least 0.33 within the processing chamber, the silicon nitride film is highly selectively etched over the silicon oxide film. In other words, it was found that, when the value of the emission spectrum ($\lambda$=263 nm) corresponding to $CF_2$ derived from the gas of the specific compound that may be represented by the composition formula $C_3H_2BrF_3$ is at least at predetermined times of the value of the emission spectrum ($\lambda$=703 nm) corresponding to F derived from the same gas within the processing chamber, the silicon nitride film may be highly selectively etched over the silicon oxide film.

—Gas of Particular Specific that May be Represented by Composition Formula $C_3H_2BrF_3$ (Gas A)—

The processing gas needs to contain the gas of the specific compound that may be represented by the composition formula $C_3H_2BrF_3$ (hereinafter, also referred to as a "gas A"). In particular, the gas A needs to include one or more gases selected from a group consisting of the 2-bromo-3,3,3-trifluoropropene gas, the (Z)-1-bromo-3,3,3-trifluoropropene gas, the (E)-1-bromo-3,3,3-trifluoro-propene gas, and the 3-bromo-2,3,3-trifluoropropene gas. Here, these gases of the specific compound have one unsaturated bond within a molecule and thus have relatively short atmospheric life and less impact on the environment. Further, by virtue of their boiling points, i.e., 2-bromo-3,3,3-trifluoropropene at 29 degrees Celsius to 30 degrees Celsius, (Z)-1-bromo-3,3,3-trifluoropropene at 57 degrees Celsius, (E)-1-bromo-3,3,3-trifluoro-propene at 39 degrees Celsius to 39.5 degrees Celsius, and 3-bromo-2,3,3-trifluoropropene at 65 degrees Celsius, these gases may be readily handled as the processing gas when being supplied to the processing chamber. Also, when the first etching condition described above is satisfied during the etching using the gas A, the silicon nitride film formed on the workpiece together with the silicone oxide film may be more selectively etched over the silicone oxide film. In the first etching step for selective etching of the silicon nitride film, the processing gas preferably has a formulation that enables the ratio $CF_2/F$ obtained by emission spectrometry of the atmosphere within the processing chamber to be at least 0.33. When the ratio $CF_2/F$ within the processing chamber is at least 0.33, an etching selectivity of the silicon nitride film relative to the silicon oxide film may be further improved. In some embodiments, the gas containing fluorine and/or carbon contained in the processing gas may be only the gas of the specific compound that may be represented by the composition formula $C_3H_2BrF_3$ described above. When $CF_2$ radical and F radical contained in the processing gas are all derived from the gas A, the ratio $CF_2/F$ of the atmosphere within the processing chamber may be easily controlled, and thus a high etching selectivity may be readily achieved. In some embodiments, the gas of the specific compound that may be represented by the composition formula $C_3H_2BrF_3$ described above may contain the 2-bromo-3,3,3-trifluoropropene gas. When the gas of the specific compound that can be represented the composition formula $C_3H_2BrF_3$ described above contains the 2-bromo-3,3,3-trifluoropropene gas, an etching selectivity may be further improved. In some embodiments, the processing gas may contain the 2-bromo-3,3,3-trifluoropropene gas as the gas containing fluorine and/or carbon. In this case, because of a fewer number of types of the gas used for the plasma etching method, the plasma etching method is highly effective and convenient.

—Ratio of Gas A in Processing Gas—

Here, the ratio of the gas A in the processing gas supplied in the first etching step is, relative to the entire processing gas set to 100% by volume, preferably at least 30% by volume, more preferably at least 35% by volume. Also, the ratio of the gas A in the processing gas supplied in the second etching step is preferably less than 30% by volume, more preferably 20% or less by volume. When the ratio of the gas A is within the above ranges in the first processing process and the second etching step, the ratio $CF_2/F$ may be readily adjusted within a desirable range in each etching step.

—Fluorocarbon Gas and Gas Containing Fluorine or Carbon—

As long as maintaining the effect of the plasma etching method according to the present disclosure, the processing gas may contain another fluorocarbon gas and, further, a gas containing fluorine or carbon, in addition to the gas A. Such a fluorocarbon gas may contain, for example, one or more types selected from a fluorocarbon group consisting of $CF_4$, $CHF_3$, $CH_2F_2$, $C_4F_6$, $C_4F_6$, and $C_5F_8$.

In addition to the gas A, the processing gas may further contain a gas containing fluorine or carbon, as long as maintaining the effect of the plasma etching method according to the present disclosure. Such a gas containing fluorine or carbon may be, for example, $SF_6$ or a hydrocarbon gas.

When the processing gas contains a fluorocarbon gas other than the 2-bromo-3,3,3-trifluoropropene gas and a gas containing fluorine or carbon, an etching rate and a shape of a pattern obtained by the etching may be appropriately adjusted in accordance with a material of the workpiece.

—Mixing Ratio of Fluorocarbon Gas—

In mixing the fluorocarbon gas other than the gas A or a gas containing fluorine or carbon to the processing gas, a mixing ratio may be determined in such a manner as to satisfy the first etching condition described above. In particular, relative to the gas A set to 100 parts by volume, the mixing ratio of the fluorocarbon gas other than the gas A and a gas containing fluorine or carbon with respect to the processing gas is preferably 5000 parts by volume or less, more preferably 2000 parts by volume or less.

—Other Gases—

As described above, other gases including a rare gas and an oxygen gas may be mixed in the processing gas, as necessary. The rare gas may be at least one selected from a group consisting of a helium gas, an argon gas, a neon gas, a krypton gas, and a xenon gas. Among them, the argon gas may be preferably used as the rare gas. The use of the processing gas containing the rare gas and the oxygen gas enables adjustment of the etching rate as necessary.

—Mixing Ratio of Rare Gas—

When the rare gas is mixed in the processing gas, a mixing ratio of the rare gas relative to the gas A set to 100 parts by volume is normally 20000 parts by volume or less, preferably 15000 parts by volume or less.

—Mixing Ratio of Oxygen Gas—

When the oxygen gas is mixed in the processing gas, a mixing ratio of the oxygen gas relative to the gas A set to 100 parts by volume is normally at least 1 part by volume, preferably at least 100 parts by volume, and normally 5000 parts by volume or less, preferably 200 parts by volume or less.

Normally, the gas A used as the processing gas and each of the fluorocarbon gas, a gas containing fluorine or carbon, a rare gas, and an oxygen gas which are optionally mixed in the processing gas are filled in respective containers such as tanks and individually transported and connected to the plasma etching apparatus. When a bulb of the tank is opened, each gas in the corresponding tank is introduced into the processing chamber subjected to action of plasma at a predetermined ratio. In this way, the etching may be proceeded in the first etching step and so on, which will be described below.

First Etching Step

The first etching step is the plasma etching performed selectively to the silicon nitride film on the workpiece over the silicon oxide film. As described above, this selective etching may be performed by using the processing gas containing the gas A and, simultaneously, satisfying the condition that the ratio $CF_2/F$ obtained by emission spectrometry of the gas A is at least 0.33 within the processing chamber during the etching. Preferably, the condition of the first etching step is that the ratio $CF_2/F$ obtained by the emission spectrometry of the gas A is at least 0.35 within the processing chamber.

The ratio $CF_2/F$ may be controlled on the basis of, for example, electric power supplied to the processing chamber, i.e., a voltage applied to an electrode provided to the processing chamber. In particular, when the parallel-plate plasma etching apparatus is used as the plasma etching apparatus, a total electric power supplied to an upper electrode and a lower electrode provided to the processing chamber is reduced to be less than that for common plasma etching, thus preventing a reduction in the ratio $CF_2/F$. That is, the electric power supplied to cause glow discharge within the processing chamber, i.e., the electric power supplied to the upper electrode of the processing chamber is reduced to be less than that for the common plasma etching and, simultaneously, the electric power supplied to the lower electrode is reduced to be less than the electric power supplied to the upper electrode and a normal amount for the lower electrode. Thus, the ratio $CF_2/F$ may be in a desired range. The reduction in the electric power supplied to the processing chamber is believed to prevent an increase in F-ions and radicals due to decomposition of $CF_2$ ions and the radicals. For example, in using a parallel-plate plasma etching apparatus of a high frequency type having the upper electrode at 60 MHz and the lower electrode at 2 MHz and a distance therebetween of 35 mm, the electric power supplied to the upper electrode may be any value within a range of 100 W to 800 W, and the electric power supplied to the lower electrode may be any value within a range of 0 W to 300 W.

Further, the ratio $CF_2/F$ may be changed also by adjusting flow rates of the various gases supplied as the processing gas and thus adjusting the mixing ratios of the various gases in the processing gas. For example, the ratio $CF_2/F$ may be increased by increasing the ratio of the gas A in the processing gas.

In order to demonstrate an excellent effect of the plasma etching, the etching is preferably performed under a high-density plasma atmosphere. A plasma density in the first and second etching steps is not particularly limited and preferably at least $10^{12}/cm^3$, more preferably $10^{12}/cm^3$ to $10^{13}/cm^3$.

Second Etching Step

The second etching step is the plasma etching performed selectively to the silicon oxide film on the workpiece over the silicon nitride film. In particular, the second etching step is a process for performing the plasma etching of the silicon oxide film on the workpiece in the processing chamber under a condition (hereinafter, also referred to as a "second etching condition") that the ratio $CF_2/F$ obtained by the emission spectrometry of the gas A is less than 0.17. The present inventor further studied on the basis of the findings of the first etching condition for contributing the selective etching of the silicon nitride film by the gas A, and found that the silicon oxide film may be selectively etched under a specific condition that the ratio $CF_2/F$ is less than 0.17. In the second etching step, the ratio $CF_2/F$ is preferably less than 0.15, more preferably less than 0.13, particularly preferably less than 0.12. Thus, the silicon oxide film may be further selectively etched over the silicon nitride film.

Here, in a manner similar to the first etching step, the ratio $CF_2/F$ in the second etching step may be controlled on the basis of the electric power supplied to the processing chamber. In particular, when the parallel-plate plasma etching apparatus is used as the plasma etching apparatus, the total electric power applied to the upper electrode and the lower electrode is set to be greater than that of the first etching step and similar to that for normal plasma etching. Thus, the ratio $CF_2/F$ may be reduced to be smaller than an intended value. In particular, the ratio $CF_2/F$ may be maintained within a desired range by setting the electric power supplied to the upper electrode of the processing chamber to be greater than that of the first etching step. Along with the increase in the electric power supplied to the upper electrode, the electric power supplied to the lower electrode is preferably reduced to be smaller than that supplied to the upper electrode and greater than that of the first etching step. For example, in using the parallel-plate plasma etching apparatus of the high frequency type having the upper electrode of 60 MHz and the lower electrode of 2 MHz and the distance therebetween of 35 mm, the electric power supplied to the upper electrode may be any value over 800 W, and the electric power supplied to the lower electrode may be any value within a range of 0 W to 500 W. When the electric power supplied to the processing chamber is increased more than that of the first etching step as described above, the ratio $CF_2/F$ may be reduced to be smaller than that of the first etching step. It is believed that, when the electric power supplied to the processing chamber is increased more than that of the first etching step, decomposition of the $CF_2$ ion or the radical into the F-ion or the radical progresses within the processing chamber, thus increasing a ratio of the F-radical within the processing chamber and reducing the ratio $CF_2/F$.

Further, for example, the ratio $CF_2/F$ may be reduced by increasing a ratio of the rare gas in the processing gas. It is believed that, when the ratio of the rare gas in the processing gas increases, rare gas ions excited within the processing chamber more frequently collide with $CF_2$ radicals and the decomposition of the $CF_2$ radicals into the F-radicals progresses, thus increasing a ratio of the F-radical within the chamber and reducing the ratio $CF_2/F$.

According to the plasma etching method of the present disclosure, the second etching step is preferably performed in addition to the first etching step. According to the plasma etching method of the present disclosure, more preferably, the first etching step and the second etching step are performed selectively. By selectively etching the silicon nitride film and the silicon oxide film, the plasma etching method may be further efficient and convenient. Here, at switchover between the first etching step and the second etching step, the gas supplied as the processing gas is preferably not changed. Each of the silicon nitride film and the silicon oxide film may be selectively etched by using the same gas, which enables prevention of cost increase and waste of time caused by addition or change of a gas.

EXAMPLE

Hereinafter, the present disclosure will be described in detail by using examples. However, the present disclosure is not limited thereto.

A workpiece, a plasma etching apparatus, and a plasma etching condition used in Examples and Comparative Examples are described below. The ratio $CF_2/F$, and the etching selectivity in the Examples and Comparative Examples were measured and evaluated as follows.

[Workpiece]

As workpieces, a plurality of chips obtained from a silicon single crystal wafer and having the following films were prepared. Some of the chips had a surface having a silicon nitride film (an $Si_3N_4$ film) formed thereon, and others had a surface having a silicon oxide film (an $SiO_2$ film) formed thereon.

[Plasma Etching Apparatus]

A parallel-plate plasma etching apparatus was used as the plasma etching apparatus. The parallel-plate plasma etching apparatus included an etching chamber (a processing chamber) provided with an upper electrode and a lower electrode therein, and a bottom surface of the upper electrode and a top surface of the lower electrode were 35 mm apart. In the parallel-plate plasma etching apparatus, a frequency of the upper electrode was 60 MHz, and a frequency of the lower electrode was 2 MHz.

[Ratio $CF_2/F$]

In Examples and Comparative Examples, an emission spectrophotometer conforming to JIS K 0116 was used for emission spectrometry during etching. From an obtained spectrum, an intensity $I_{CF2}$ of a bright line spectrum ($\lambda$=263 nm) derived from $CF_2$ and an intensity $I_F$ of a bright line spectrum ($\lambda$=703 nm) derived from F were obtained, and thus a ratio ($I_{CF2}/I_F$) was calculated. Note that there was no substance that may by a source of $CF_2$ radical or F radical, other than the gas A within the processing chamber during etching. Accordingly, the measured values correspond to the ratio $CF_2/F$ obtained by the emission spectrometry of the gas A.

[Etching Selectivity]

In Examples and Comparative Examples, a thickness of the film on each of the wafers before and after etching was measured, and an etching rate was calculated by using the thickness. In Examples and Comparative Examples, the etching was performed for 60 seconds. Thus, a value obtained by subtracting the thickness of the film after the etching from the thickness of the film before the etching directly corresponds to the etching rate. By using the etching rate thus calculated, the etching selectivity was calculated on the basis of the formulas set forth below. When the denominator was 0 or less, the etching selectivity was determined as infinite ($\infty$). A larger etching selectivity corresponds to a more preferential etching of the etching target film. When the etching selectivity is infinite, the non-target film corresponding to the denominator was not etched at all or was protected by deposits covering the non-target film.

Etching selectivity of the silicon nitride film over the silicon oxide film ($Si_3N_4/SiO_2$)=(Etching rate of $Si_3N_4$ film/Etching rate of $SiO_2$ film)

Etching selectivity of the silicon oxide film over the silicon nitride film ($SiO_2/Si_3N_4$)=(Etching rate of $SiO_2$ film/Etching rate of $Si_3N_4$ film)

Example 1

In the preparing step, first, a workpiece having a surface with a $Si_3N_4$ film formed thereon and a workpiece having a surface with a $SiO_2$ film formed thereon were placed in the processing chamber, which was then vacuumed. Subsequently, the 2-bromo-3,3,3-trifluoropropene ($C_3H_2BrF_3$) gas (hereinafter, also referred to as the "gas A") and an oxygen gas were introduced at rates of 45 sccm and 62 sccm, respectively, into the processing chamber. The pressure within the processing chamber was set to 4 Pa (approx. 30 mTorr). The temperature of the upper electrode and sidewalls of the processing chamber was set to 60 degrees Celsius, and the temperature of the lower electrode was set to 20 degrees Celsius. The temperature of the workpiece was 20 degrees Celsius, as with the lower electrode.

Then, in the first etching step, plasma etching was performed to these workpieces placed within the processing chamber by supplying the electric power of 450 W to the upper electrode and the electric power of 35 W to the lower electrode for 60 minutes. In the first etching step, the ratio $CF_2/F$ within the processing chamber was measured in the above manner. Then, the etching selectivity of each of resulting workpieces was measured in the above manner. Results are illustrated in Table 1.

Example 2

Plasma etching was performed in the same manner as Example 1, except for changing the feeding rates of the gas A and the oxygen gas as illustrated in Table 1. Then, in a manner similar to Example 1, the ratio $CF_2/F$ and the etching selectivity were calculated. Results are illustrated in Table 1.

Examples 3 to 4

Plasma etching was performed in the same manner as Example 1, except for changing the feeding rates of the gas A and the oxygen gas and the electric power supplied to the upper electrode as illustrated in Table 1. Then, in a manner similar to Example 1, the ratio $CF_2/F$ and the etching selectivity were calculated. Results are illustrated in Table 1.

Comparative Examples 1 to 9 and 13

Plasma etching was performed in the same manner as Example 1, except for changing the feeding rates of the gas A and the oxygen gas and the electric power supplied to the upper electrode and the lower electrode as illustrated in Table 1. Then, in a manner similar to Example 1, the ratio $CF_2/F$ and the etching selectivity were calculated. Results are illustrated in Table 1.

Comparative Examples 10-12

Plasma etching was performed in the same manner as Example 1, except for supplying the processing gas containing an Ar gas at the feeding rate illustrated in Table 1 and, further, changing electric power supplied to the upper electrode and the lower electrode as illustrated in Table 1. Then, in a manner similar to Example 1, the ratio $CF_2/F$ and the etching selectivity were calculated. Results are illustrated in Table 1.

TABLE 1

|  |  |  | Example | | | | Comparative Example | | | | |
|---|---|---|---|---|---|---|---|---|---|---|---|
|  |  |  | 1 | 2 | 3 | 4 | 1 | 2 | 3 | 4 | 5 |
| Condition | Processing Gas | Gas A ($C_3H_2BrF_3$) [sccm] | 45 | 60 | 60 | 60 | 60 | 60 | 60 | 60 | 60 |
|  |  | Oxygen Gas [sccm] | 62 | 87 | 93 | 98 | 100 | 103 | 105 | 100 | 105 |
|  |  | Ar Gas [sccm] | — | — | — | — | — | — | — | — | — |
|  |  | Ratio of Gas A [% by Volume] | 42 | 41 | 39 | 38 | 38 | 37 | 36 | 38 | 36 |
|  | Electric Power | Upper Electrode [W] | 450 | 450 | 600 | 750 | 900 | 900 | 900 | 1000 | 1000 |
|  | Supply | Lower Electrode [W] | 35 | 35 | 35 | 35 | 35 | 35 | 35 | 35 | 35 |
|  | Ratio $CF_2$/F [—] | | 0.53 | 0.51 | 0.41 | 0.36 | 0.32 | 0.32 | 0.32 | 0.32 | 0.32 |
| Evaluation | Etching | $SiO_2$ [nm/min] | −0.4 | −3.7 | −3.1 | −1.1 | −31.9 | 17.4 | 70.3 | −23.3 | 93.5 |
|  | Rate | $Si_3N_4$ [nm/min] | 23.5 | 19.1 | 20.3 | 22.1 | −40.9 | 23.2 | 58.6 | −35.3 | 100.0 |
|  | Etching | $Si_3N_4/SiO_2$ [—] | ∞ | ∞ | ∞ | ∞ | — | 1.33 | 0.83 | — | 1.07 |
|  | Selectivity | $SiO_2/Si_3N_4$ [—] | — | — | — | — | — | 0.75 | 1.20 | — | 0.94 |

|  |  |  | Comparative Example | | | | | | | |
|---|---|---|---|---|---|---|---|---|---|---|
|  |  |  | 6 | 7 | 8 | 9 | 10 | 11 | 12 | 13 |
| Condition | Processing Gas | Gas A ($C_3H_2BrF_3$) [sccm] | 60 | 60 | 60 | 60 | 20 | 20 | 20 | 20 |
|  |  | Oxygen Gas [sccm] | 110 | 108 | 110 | 115 | 30 | 30 | 30 | 30 |
|  |  | Ar Gas [sccm] | — | — | — | — | 200 | 100 | 50 | — |
|  |  | Ratio of Gas A [% by Volume] | 35 | 36 | 35 | 34 | 8 | 13 | 20 | 40 |
|  | Electric Power | Upper Electrode [W] | 1000 | 1300 | 1300 | 1000 | 1300 | 1300 | 1300 | 1300 |
|  | Supply | Lower Electrode [W] | 35 | 35 | 35 | 35 | 400 | 400 | 400 | 400 |
|  | Ratio $CF_2$/F [—] | | 0.31 | 0.31 | 0.31 | 0.29 | 0.11 | 0.13 | 0.15 | 0.18 |
| Evaluation | Etching | $SiO_2$ [nm/min] | 103.7 | −69.6 | 84.5 | 111.1 | 343.4 | 348.7 | 302.1 | 201.9 |
|  | Rate | $Si_3N_4$ [nm/min] | 127.6 | −69.7 | 68.3 | 119.3 | 13.5 | 32.5 | 294.0 | 233.1 |
|  | Etching | $Si_3N_4/SiO_2$ [—] | 1.23 | — | 0.81 | 1.07 | 0.04 | 0.09 | 0.97 | 1.15 |
|  | Selectivity | $SiO_2/Si_3N_4$ [—] | 0.81 | — | 1.24 | 0.93 | 25.5 | 10.72 | 1.03 | 0.87 |

It can be seen from Table 1 that, in Examples 1 to 4 in which the plasma etching was performed by supplying the processing gas containing the gas A into the processing chamber in such a manner that the ratio $CF_2$/F obtained by the emission spectrometry of the gas A was at least 0.33, the selectivity ($Si_3N_4/SiO_2$) of the silicon nitride film over the silicon oxide film was infinity (∞), i.e., excellent. On the other hand, in Comparative Examples 1 to 13 in which the plasma etching was performed by using the processing gas containing the gas A and the ratio $CF_2$/F was smaller than 0.33, the value ($Si_3N_4/SiO_2$) was not favorable. Especially in Comparative Examples 10 to 12 in which the Ar gas was mixed with the processing gas in addition to the gas A and the oxygen gas A, the ratio $CF_2$/F was smaller than 0.33 and the etching rate of $SiO_2$ was faster than the etching rate of SiN, thus disabling selective etching of SiN. In Comparative Examples 10 to 12, rather, the etching selectivity ($SiO_2/Si_3N_4$) of the silicon oxide film over the silicon nitride film was greater than 1, and the silicon oxide film was selectively etched. Accordingly, performing plasma etching of the second etching step for selectively etching the silicon oxide film under the conditions of Comparative Examples 10 to 12 in addition to the first etching step as illustrated in Examples 1 to 4 enables change of the etching target for the selective etching simply by changing the ratio $CF_2$/F without changing the gas A serving as the processing gas. This is advantageous in terms of preventing the cost increase and waste of time caused by change of the gas.

INDUSTRIAL APPLICABILITY

According to the present disclosure, the silicon nitride film may be highly selectively etched by using the plasma etching gas having a relatively small impact on the environment.

The invention claimed is:

1. A plasma etching method capable of etching a workpiece having a silicon nitride film, the plasma etching method comprising:
    a preparation step of placing the workpiece within a processing chamber; and
    a first etching step of performing plasma etching of the silicon nitride film on the workpiece by supplying a processing gas containing a gas of a compound represented by a composition formula $C_3H_2BrF_3$ including a 2-bromo-3,3,3-trifluoropropene gas, a (Z)-1-bromo-3,3,3-trifluoropropene gas, an (E)-1-bromo-3,3,3-trifluoropropene gas, and/or a 3-bromo-2,3,3-trifluoropropene gas into the processing chamber, such that a ratio $CF_2$/F obtained by emission spectrometry of the gas of the compound represented by the composition formula $C_3H_2BrF_3$ is at least 0.33 within the processing vessel.

2. The plasma etching method according to claim 1,
wherein the workpiece further includes a silicon oxide film,
the plasma etching method further includes a second etching step of performing plasma etching of the silicon oxide film on the workpiece under a condition that the ratio $CF_2$/F is smaller than 0.17, and
the first etching step and the second etching step are selectively performed.

3. The plasma etching method according to claim 1,
wherein a gas containing fluorine and/or carbon contained in the processing gas consists of the gas of the compound represented by the composition formula $C_3H_2BrF_3$.

4. The plasma etching method according to claim 1,
wherein the gas of the compound represented by the composition formula $C_3H_2BrF_3$ contains the 2-bromo-3,3,3-trifluoropropene gas.

* * * * *